United States Patent [19]

Tanaka

[11] 4,186,285

[45] Jan. 29, 1980

[54] MULTIPLE PUSHBUTTON SWITCH ASSEMBLY

[75] Inventor: Yoshito Tanaka, Tokyo, Japan

[73] Assignee: Toko Kabushiki Kaisha, Tokyo, Japan

[21] Appl. No.: 897,638

[22] Filed: Apr. 18, 1978

[30] Foreign Application Priority Data

Apr. 20, 1977 [JP] Japan ............................ 52-50059[U]
Aug. 18, 1977 [JP] Japan ............................ 52-109562[U]
Sep. 2, 1977 [JP] Japan ............................ 52-118252[U]

[51] Int. Cl.[2] ........................ H10H 9/26; H01H 15/00

[52] U.S. Cl. .................................. 200/5 E; 200/16 F; 200/50 C

[58] Field of Search .................... 200/5 B, 5 E, 5 EA, 200/5 EB, 50 C, 76, 16 F; 74/483 PB

[56] References Cited

U.S. PATENT DOCUMENTS 2,618,715 11/1952 Cataldo .................................. 200/76
3,666,899 5/1972 Kerr ...................................... 200/5 E
3,732,476 5/1973 Cairelli ............................ 200/5 E X
3,746,802 7/1973 Sundi et al. .......................... 200/5 E
3,796,844 3/1974 Osika ..................................... 200/5 E
3,939,318 2/1976 Brown et al. ............................ 200/76
4,016,377 4/1977 Iwasaki ................................ 200/16 F
4,074,089 2/1978 Mitsugi et al. ...................... 200/76 X
4,137,438 1/1979 Sato et al. ...................... 200/16 F X

FOREIGN PATENT DOCUMENTS 1078213 3/1960 Fed. Rep. of Germany ............. 200/76

*Primary Examiner*—James R. Scott
*Attorney, Agent, or Firm*—Wenderoth, Lind & Ponack

[57] ABSTRACT

In a multiple pushbutton switch assembly, a flexible restoring tape has both ends affixed to the casing at both ends with a predetermined slack in such a manner that it is tensioned by depressing any one of the sliders which, when depressed, are locked alternately at a switch-on position and a switch-off position by elastic springs. The amount of the predetermined slack of the restoring tape corresponds to the amount of depression of each slider, so that when one slider is depressed, another one which has been depressed is restored or returned to its initial position, and only one slider is allowed to be depressed at any one time.

2 Claims, 8 Drawing Figures

MULTIPLE PUSHBUTTON SWITCH ASSEMBLY

BACKGROUND OF THE INVENTION

This invention relates to multiple pushbutton switch assemblies, and more particularly to a locking mechanism, interlocking mechanism and terminal configuration of a multiple pushbutton switch assembly.

In one conventional multiple pushbutton switch assembly, sliders are locked by allowing tongue-shaped pieces of a locking plate to engage with saw-tooth-shaped cam grooves formed on the sides of the sliders in a direction perpendicular to the axis of the slider. The recent tendency in manufacturing electronic equipment is to miniaturize it. Accordingly, it has been a desideratum in the art to provide a multiple pushbutton switch assembly which is small in size and can be operated with a small operating force, and which has a short operating stroke. However, with such a conventional multiple pushbutton switch assembly as described above, the operating stroke of the slider cannot be reduced without decreasing the distance between two adjacent cam grooves, and it is difficult from the standpoint of the durability of the cam grooves to reduce the distance between the adjacent cam grooves to 2 mm or less. In addition, the effort to reduce the operating force substantially reaches a limit.

SUMMARY OF THE INVENTION

Accordingly, an object of this invention is to eliminate the above-described difficulties in the conventional multiple pushbutton switch assembly.

More specifically, an object of the invention is to provide a multiple pushbutton switch assembly in which the operating stroke and the operating force are greatly reduced.

The foregoing objects and other objects of the invention have been achieved by providing a multiple pushbutton switch assembly which, according to this invention, comprises: a casing in which stationary terminals are embedded; a flexible restoring member the two ends of which are fixedly secured to the casing with slack therebetween; a plurality of sliders each having a head, each slider being slidable in the casing so as to abut against the restoring member; and an elastic element provided for each of the sliders, the elastic elements being mounted in the casing so as to lock the respective sliders alternately at a switch-on position and a switch-off position, the slack of the restoring member being sufficient to allow the depression of only one slider.

The nature, principle and utility of the invention will become more apparent from the following detailed description and the appended claims when read in conjunction with the accompanying drawings.

DETAILED DESCRIPTION OF THE INVENTION

One preferred example of a multiple pushbutton switch assembly according to this invention will be described with reference to FIGS. 1 and 2.

Figure 1:
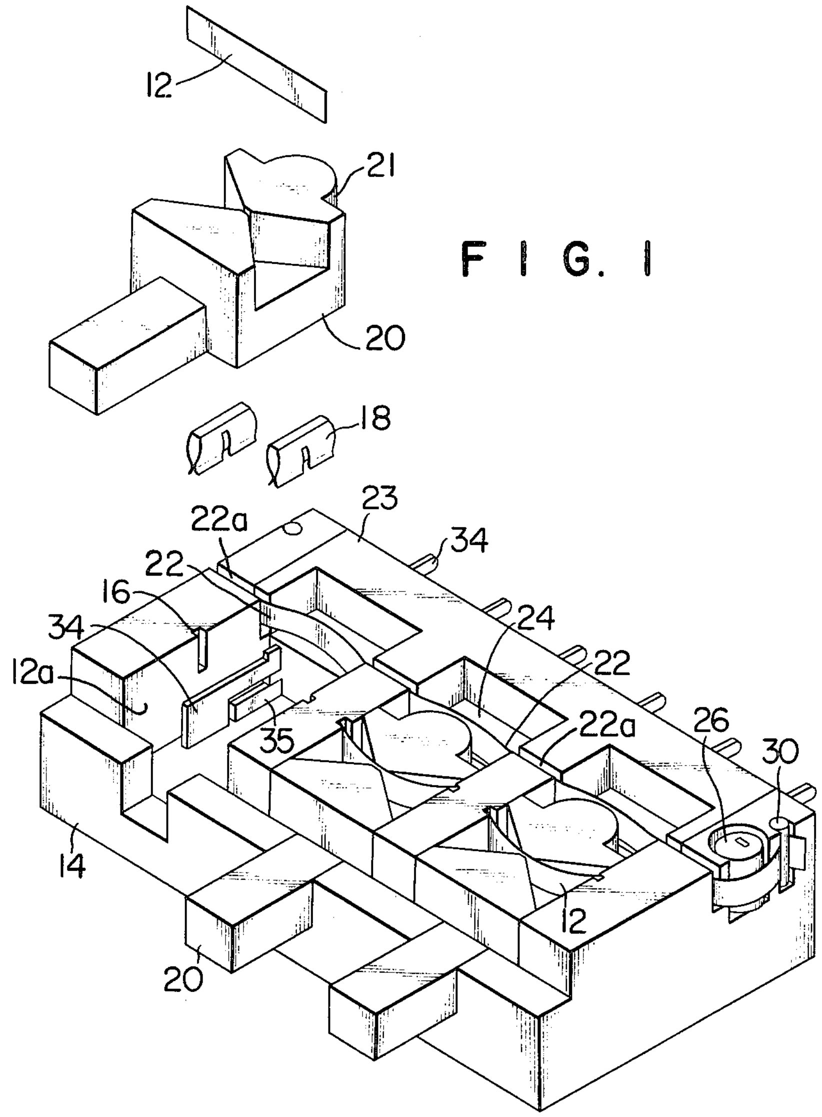
FIG. 1 is an exploded perspective view showing one preferred example of a multiple pushbutton switch assembly according to this invention.
Figure 2:
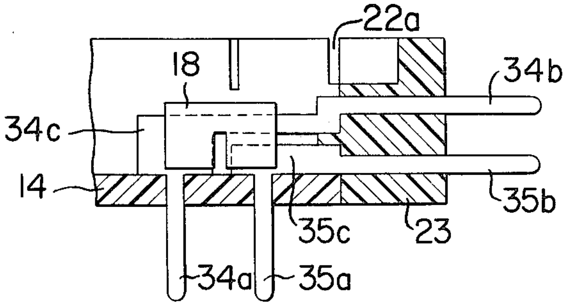
FIG. 2 is a sectional side view thereof illustrating essential parts including stationary contacts of the switch assembly.

Referring to FIG. 1, reference numeral 12 is intended to designate a plurality of thin elastic elements each made of metal or synthetic resin. Both ends of each elastic element 12 are inserted into grooves 16 proved in the walls defining slider accomodating grooves 12*a*, in a casing 14 with the elastic element 12 being bent so that the latter can be bent back and forth by snap action. Reference numeral 20 designates a plurality of sliders each holding movable contacts 18 and sliding along respective slider accomodating grooves 12*a* in the casing 14. Each slider 20 is engaged with the central portion of the corresponding elastic element 12 so that it is locked in one of two positions by the snap action of the elastic element 12. Reference numeral 22 designates a restoring, or resetting, member made of a smooth and flexible tape, which has both ends fastened to the casing 14 and which has a slight amount of slack therein. It is accomodated in restoring member groove 22*a* which extends between grooves 12*a* and the opposite ends of the casing 12. When one of the sliders 20 is depressed, its head 21 abuts against the restoring member 22, and the head 21 and the restoring member 22 are moved into a corresponding one of recesses 24 formed in a rear plate 23 which is fitted to the rear wall of the casing 14, as a result of which the slider 20 is locked at a switchon position by the elastic element 12. It should be noted that the amount in slack of the restoring member 22 corresponds to the amount of displacement of one slider 20 obtained when the latter is depressed as described above, and accordingly only one slider is locked at its switch-on position at all times although the multiple pushbutton switch assembly has a plurality of pushbutton switches.

An adjusting element 26 having an eccentric axis is rotatably provided in the casing 14. By turning the adjusting element 26 the amount in slack of the restoring member 22 the two ends of which have been fastened to the casing 14 can be finely adjusted. After completion of the adjustment, the adjusting element 26 is fixedly secured by coating it with a paint. Alternatively the adjusting element 26 may have an elliptical cross-section and be axially rotatably mounted. Reference numeral 30 designates a locking element which is adapted to lock the restoring member 22 in a groove formed in the casing 14.

Reference numerals 34 and 35 designate stationary contacts embedded in the casing 14 and the rear plate 23. As is apparent from FIG. 2, the stationary contact 34 comprises a lower terminal 34*a*, a rear terminal 34*b* and a contact part 34*c* which are formed as one unit. Similarly, the stationary contact 35 comprises a lower terminal 35*a*, a rear terminal 35*b* and a contact part 35*c* which are formed as one unit. The stationary contacts 34 and 35 are fixedly secured by inserting the lower terminals 34*a* and 35*a* into holes formed in the casing 14 and by inserting the rear terminals 34*b* and 35*b* into holes formed in the rear plate 23, respectively.

Figure 3:
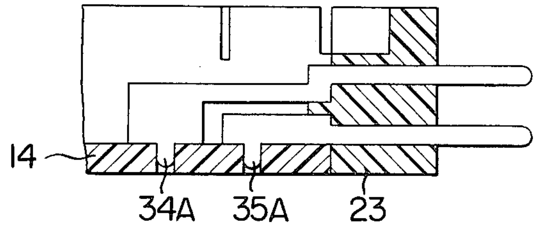
FIG. 3 is a sectional side view showing one modification of the stationary contacts shown in FIG. 2.

If the stationary contacts 34 and 35 are modified as shown in FIG. 3 in such a manner that they have shorter lower terminals 34A and 35A, respectively, the switch assembly will have terminals on the rear side only.

Figure 4:
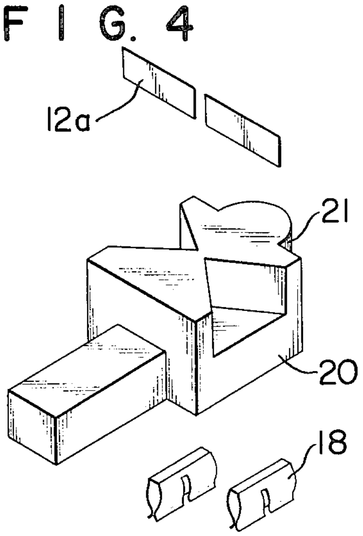
FIG. 4 is an exploded perspective view showing one modification of the elastic element shown in FIG. 1.

In the switch assembly described, one elastic element 12 is employed for each pushbutton switch; however, the same effect can be obtained by providing two elastic elements 12a engaging the opposite sides of the slider 20 as illustrated in FIG. 4.

The operation of the multiple pushbutton switch assembly will be described with reference to FIGS. 5(A) through 5(D), which schematically illustrate the switch assembly. In FIGS. 5(A) through 5(D) those components which have been previously described with reference to FIG. 1 have been similarly numbered.

Figure 5A:
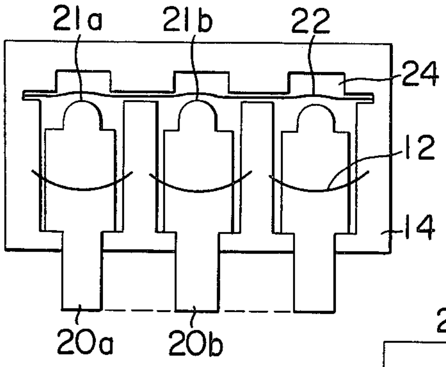
FIGS. 5(A) through 5(D) are schematic diagrams for describing of the operation of the switch assembly according to the invention.
Figure 5B:
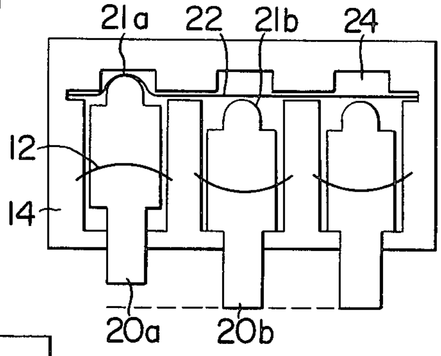
Figure 5C:
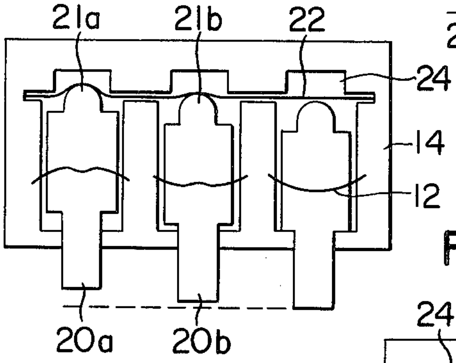
Figure 5D:
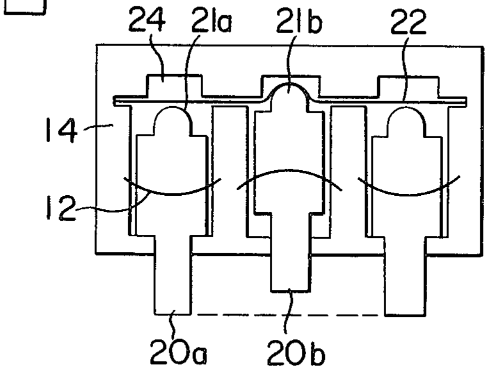

FIG. 5(A) shows the state of the switch assembly in which none of the sliders are depressed, that is, all the switches are in the "off" state. When, under this condition, the leftmost slider 20a is depressed, the head 21a of the slider 20a is abutted against the restoring member 22, and the head 21a and the restoring member 22 are moved into the recess 24 in the rear plate 23, while the elastic element 12 is bent rearwardly, as a result of which the slider 20a is locked at the switch-on position as shown in FIG. 5(B). When, with the switch assembly in this condition, the middle slider 20b is depressed, similarly as in the case of the left-most slider 20a, the head 21b and the restoring member 22 are moved into the recess 24, and the slider 20b is locked at the switch-on position. During this operation, since the amount of slack in the restoring member 22 corresponds to the amount of displacement (depression) of only one slider as was described before, the left-most slide 20a which has been locked at the switch-on position is restored, that is, it is returned to its initial switch-off position as the middle slider 20b is depressed. In other words, the restoring member 22 is tensioned by depressing the middle slider to return the left-most slider 20a to its switch-off position. Thus, the sliders 20a and 20b are locked at the positions shown in FIG. 5(D) after passing through the state shown in FIG. 5(C).

In the above-described switch assembly, the resetting member is in the form of a tape; however, it may be replaced by a rope-shaped member, a chain-shaped member, or the like if such a member can bend without contracting and expanding.

In the multiple pushbutton switch assembly constructed as described above according to this invention, the stroke of the slider is considerably reduced, and furthermore it is possible to reduce the operating force for the switch assembly. In addition, the number of components of the switch assembly according to the invention is much smaller than that of the conventional switch assembly, and accordingly the size of the switch assembly of the invention is smaller and the work required for the assembly thereof can be simplified. The restoring member adapted to return the sliders serves also as a means to prevent a plurality of switches from being simultaneously operated. This is one of the great advantages in practical use. Furthermore, according to the invention, the stationary contacts can be readily incorporated in the casing without caulking, and it is possible to provide the terminals on the rear side and/or on the bottom side of the switch assembly. This means that the switch assembly according to the invention can be used in a variety of ways.

What is claimed is:

1. A multiple pushbutton switch assembly which comprises:

(a) a casing having a plurality of slider accomodating recesses therein and restoring member accomodating grooves in a straight line connecting said plurality of recesses and having a rear plate fitted onto the rear side of said housing;

(b) a plurality of sliders slidably mounted in corresponding ones of said plurality of slider accomodating recesses, each slider having a contact receiving recess in the one sliding surface and a leaf spring receiving recess in the opposite surface;

(c) a plurality of movable contacts, one in each of said contact receiving recesses in the one sliding surfaces of said sliders, each movable contact having a U-shaped cross-section and a contact section formed by two opposed inner wall surfaces thereof;

(d) a plurality of pairs of stationary contacts in said casing and having a portion of the contacts of each pair projecting into a corresponding slider accomodating recess for being engaged by and connected electrically to each other by said movable contacts when the corresponding slider is in one position in the slider accomodating recess and being disconnected when the corresponding slider is in a second position;

(e) a leaf spring means in the leaf spring receiving recess in each of said sliders, each leaf spring in a bent state with the opposite ends thereof fixed in said casing and with the central part thereof engaged with said slider for holding the corresponding slider alternately in the first position and the second position in said casing; and (f) a restoring member extending through said restoring member accomodating grooves in said casing and being contacted by one end of each of said sliders and with the opposite ends fixedly secured to said casing and having an amount of slack for causing said restoring member to be in contact with all of said sliders and permitting the depression of only one slider.

2. A multiple pushbutton switch assembly as claimed in claim 1 in which each of said stationary contacts further comprises a lower terminal in said casing, a rear terminal extending into said rear plate, said contact portions of each pair being aligned parallel with the direction of movement of the corresponding slider with said opposed inner walls of the corresponding movable contact engaging the opposite sides of the contact portions of said stationary contacts.

* * * * *